(12) United States Patent
Morris et al.

(10) Patent No.: US 7,451,539 B2
(45) Date of Patent: Nov. 18, 2008

(54) METHOD OF MAKING A CONFORMAL ELECTROMAGNETIC INTERFERENCE SHIELD

(75) Inventors: Thomas Scott Morris, Clemmons, NC (US); Milind Shah, Greensboro, NC (US); Donald Joseph Leahy, Kernersville, NC (US); Lewis Kermit Law, II, Kernersville, NC (US)

(73) Assignee: RF Micro Devices, Inc., Greensboro, NC (US)

( * ) Notice: Subject to any disclaimer, the term of this patent is extended or adjusted under 35 U.S.C. 154(b) by 265 days.

(21) Appl. No.: 11/199,319

(22) Filed: Aug. 8, 2005

(65) Prior Publication Data

US 2007/0030661 A1   Feb. 8, 2007

(51) Int. Cl.
*H05K 3/30* (2006.01)
*H01L 21/00* (2006.01)
(52) U.S. Cl. .............................. 29/832; 29/825; 29/840; 438/33; 438/112; 438/113
(58) Field of Classification Search .................. 29/825, 29/832, 840; 257/734; 438/33, 112, 113
See application file for complete search history.

(56) References Cited

U.S. PATENT DOCUMENTS

| | | | | |
|---|---|---|---|---|
| 6,150,193 A * | 11/2000 | Glenn | .................. | 438/113 |
| 6,448,793 B1 | 9/2002 | Barratt et al. | ............... | 324/693 |
| 6,633,073 B2 | 10/2003 | Rezvani et al. | ............... | 257/504 |
| 6,657,592 B2 | 12/2003 | Dening et al. | ............... | 343/700 |
| 6,825,560 B1 | 11/2004 | Walker et al. | ............... | 257/746 |
| 6,887,787 B2 * | 5/2005 | Farnworth | .................. | 438/653 |
| 7,030,469 B2 | 4/2006 | Mahadevan et al. | | |
| 7,125,744 B2 * | 10/2006 | Takehara et al. | ............ | 438/106 |
| 2002/0036345 A1 * | 3/2002 | Iseki et al. | .................. | 257/734 |
| 2004/0104473 A1 * | 6/2004 | Farnworth | .................. | 257/734 |
| 2004/0209434 A1 | 10/2004 | Seaford et al. | ............. | 438/376 |
| 2007/0030661 A1 * | 2/2007 | Morris et al. | ............... | 361/818 |
| 2007/0163802 A1 | 7/2007 | Monthei | | |
| 2008/0157316 A1 * | 7/2008 | Yang | ......................... | 257/685 |
| 2008/0224306 A1 * | 9/2008 | Yang | ......................... | 257/725 |

OTHER PUBLICATIONS

RF6001, "Fractional-N RF Synthesizer With Modulator and Digital IF Filter", Rev A2 050602, 2 pages.
"Conductive Compounds Cho-Sheild Conductive Coatings", Chomerics, 3 pages.

* cited by examiner

*Primary Examiner*—C. J Arbes
(74) *Attorney, Agent, or Firm*—Withrow & Terranova, P.L.L.C.

(57) ABSTRACT

An electromagnetic shield for an electronic module includes a surface finish that is applied to the surface of an electronic module so as to minimize the size of the shield. Once the shield is in place, the shield acts to address electromagnetic interference (EMI) concerns associated with the electronic module. An electronic module having a ring of conductive material embedded about its peripheral edge is formed. The electronic module is then sub-diced so as to expose the ring of conductive material. After sub-dicing, a conductive material may be applied through an electroless plating process followed by an electrolytic plating process. Alternatively, a conductive epoxy may be sprayed or painted onto the surface of the electronic module.

24 Claims, 7 Drawing Sheets

METHOD OF MAKING A CONFORMAL ELECTROMAGNETIC INTERFERENCE SHIELD

FIELD OF THE INVENTION

The present invention relates to a shield for an electronic module, wherein the shield is designed to reduce electromagnetic interference experienced by the electronic module.

BACKGROUND OF THE INVENTION

Electronic components have become ubiquitous in modern society. The electronics industry proudly, but routinely, announces accelerated clocking speeds and smaller integrated circuit modules. While the benefits of these devices are myriad, smaller and faster electronic devices create problems. In particular, high clock speeds inherently require fast transitions between signal levels. Fast transitions between signal levels create electromagnetic emissions throughout the electromagnetic spectrum. Such emissions are regulated by the Federal Communications Commission (FCC) and other regulatory agencies. Furthermore, fast speed inherently means higher frequencies. Higher frequencies mean shorter wavelengths. Shorter wavelengths mean shorter conductive elements act as antennas to broadcast these electromagnetic emissions. These electromagnetic emissions radiate from a source and may impinge upon other electronic components. If the signal strength of the emission at the impinged upon electronic component is high enough, the emission may interfere with the operation of the impinged upon electronic component. This phenomenon is sometimes called electromagnetic interference (EMI) or crosstalk. Dealing with EMI and crosstalk is sometimes referred to as electromagnetic compatibility (EMC). Other components, such as transceiver modules, inherently have lots of radiating elements that raise EMI concerns. Thus, even electronic modules that do not have high clock speeds may need to address EMI issues.

One way to reduce EMI to comply with FCC regulations is to shield the electronic modules. Typically the shield is formed from a grounded conductive material that surrounds the electronic module. When electromagnetic emissions from the module strike the interior surface of the conductive material, the electromagnetic emissions are electrically shorted through the grounded conductive material, thereby reducing emissions. Likewise, when emissions from another radiating element strike the exterior surface of the conductive material, a similar electrical short occurs, and the module does not suffer from EMI from other modules.

However, as the electronic modules continue to become smaller from miniaturization, creating effective shields that do not materially add to the size of the module becomes more difficult. Thus, there is a need for an electromagnetic shield that is inexpensive to manufacture on a large scale, does not substantially change the size of the electronic module, and effectively deals with EMI concerns.

SUMMARY OF THE INVENTION

The present invention is directed to a method of making an electromagnetic shield for an electronic module. The shield is a surface finish that is applied to the surface of an electronic module so as to reduce the size of the shield. Once the shield is in place, the shield acts to address electromagnetic interference (EMI) concerns associated with the electronic module. There are two primary embodiments of the present invention.

In both embodiments, an electronic module having a groundable ring of conductive material embedded about its peripheral edge is formed. The module is then sub-diced so as to expose the ring of conductive material. The shield is applied to the surface of the electronic module and electrically coupled to the groundable ring of conductive material. In use, the ring of conductive material is grounded, thereby grounding the shield.

In the first embodiment, an electroless plating process forms a seed layer of conductive material, such as copper (Cu), over the module. The seed layer then carries current for an electrolytic plating process, which deposits a second conductive layer on the seed layer. A third layer may be applied through a second electrolytic plating process. The third layer is a relatively poor conductor compared to the seed layer and the second conductive layer, and may be formed with a material such as nickel (Ni). The seed layer and second layer form a conductive layer that provides an effective electromagnetic shield around the module. The nickel lay may contribute to the conduction that helps shield the module and may also provide some absorption of electromagnetic signals to further shield the module. It should be appreciated that the side of the module that has the electrical contacts is masked during the plating processes such that the plating does not interfere with the contacts of the module.

The second embodiment includes a conductive epoxy paint sprayed on the electronic module. In particular, the epoxy may include copper (Cu) and/or silver (Ag) flecks therein. When the epoxy is sprayed on the electronic module, the flecks form a conductive layer that shields the electronic module. It should be appreciated that the side of the module that has the electrical contacts is masked during the spraying step so that the spray does not interfere with the contacts of the module.

Both embodiments are designed to be implemented prior to singulation of the electronic modules. Thus, after the shield is applied, electronic modules may be singulated one from another and further processed as needed or desired. The mask may be removed before or after singulation.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention is directed to providing improved manufacturing techniques to shield an electronic module. While the present invention is particularly contemplated as being appropriate for a transceiver module, the present invention could be used with any number of different electronic modules. The manufacturing techniques of the present invention insert a conductive element around the periphery of the electronic module. After a sub-dicing step is performed to expose the conductive element around the periphery of the module, the top surface of the module is roughened. In one embodiment, an electroless plating process deposits a conductive seed layer on the module. Then an electrolytic plating process is used to deposit a second conductive layer on the seed layer. A final layer of a material such as nickel is then deposited on top of the second conductive layer through another electrolytic plating process. In a second embodiment, after the sub-dicing and roughening steps, a conductive epoxy or paint is applied to the module. In both embodiments, the conductive layers formed by the process form an electromagnetic shield around the electronic module so as to reduce electromagnetic interference (EMI).

The present invention is well suited for use with an electronic module for transceivers, such as the RF6001 sold by RF Micro Devices of 7628 Thorndike Road, Greensboro, N.C. 27409-9421. The datasheet for the RF6001 can be found online at http://www.rfmd.com/DataBooks/db97/6001_2pg.pdf, is herein incorporated by reference in its entirety, and is enclosed in the Information Disclosure Statement accompanying the present application. When the present invention is applied to an electronic module, such as the RF6001, certain changes must be made to the electronic module as will become clear from the discussion presented below. It should be appreciated that other electronic modules, such as power amplifier modules, receiver modules, transmitter modules, and the like, could also benefit from the present invention, and the present invention is not limited to a particular type of electronic module.

Figure 1:
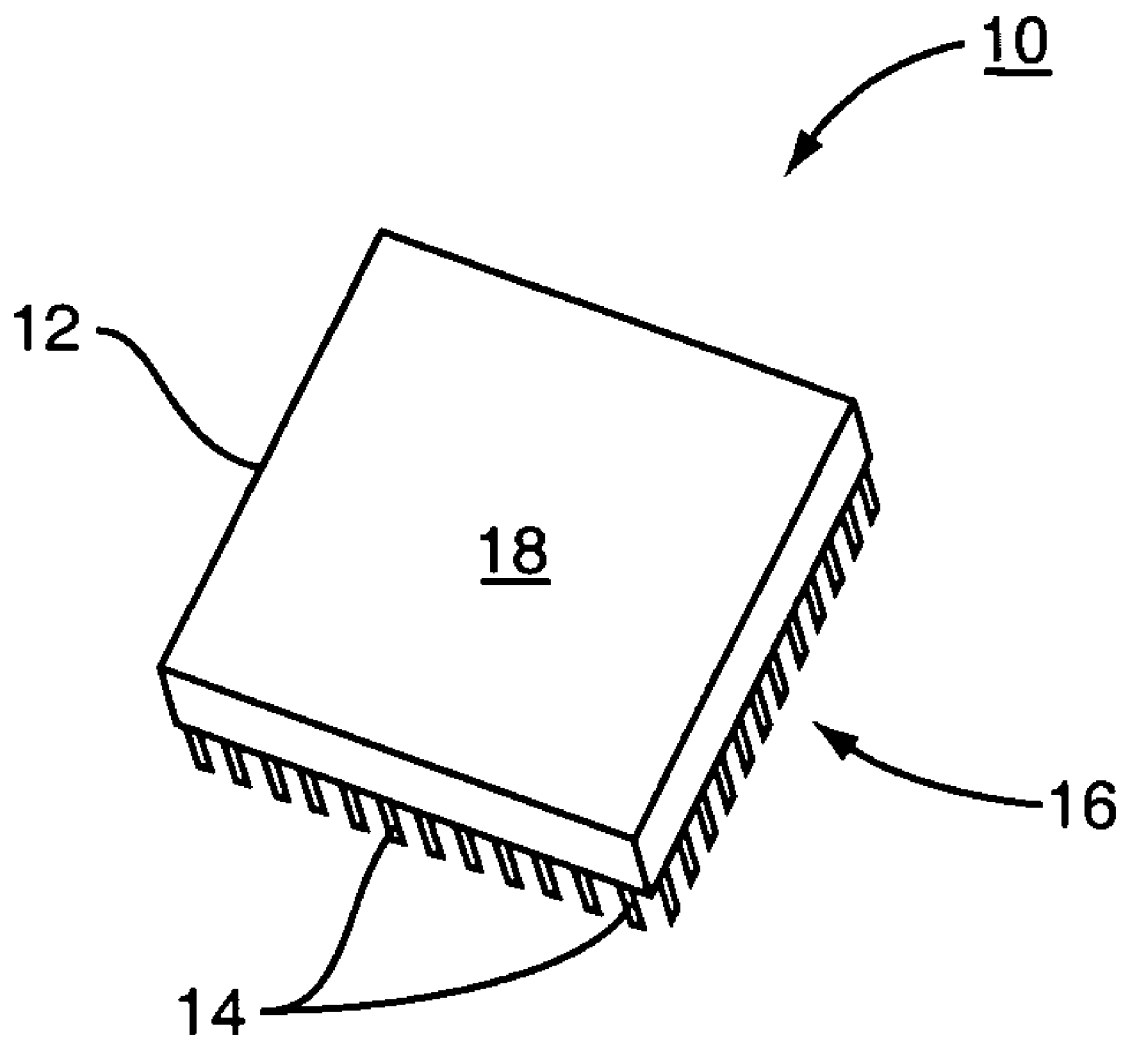
FIG. 1 illustrates a perspective view of a typical electronic module.

A conventional electronic module 10 is illustrated in FIG. 1. The electronic module 10 includes a body 12 made from a dielectric material molded into a desired shape with several contacts 14 positioned on an input/output (I/O) face 16 of the electronic module 10. Conceptually the I/O face 16 is the bottom face of the electronic module 10. Electrical components (not particularly illustrated) are embedded inside the body 12, as is well understood. The electronic module 10 may include a plurality of conductive layers and a plurality of dielectric layers sandwiched one on top of the other within the body 12, as is conventional. Conductive vias (also not illustrated) electrically couple the conductive layers one to the other as needed or desired. In practice, the vias act as a shield for lateral electromagnetic emissions from the electronic module 10. However, a top surface 18 of the electronic module 10 is not protected by the vias and thus allows electromagnetic emissions to escape from the electronic module 10. While the contacts 14 are illustrated as pins, it should be appreciated that the electronic module 10 may also use a land or ball grid array as the contact points for the electronic module 10. For an example of a ball grid array, see FIGS. 7 and 9. The thin nature of the land grid array makes it well suited for certain applications, but makes the illustration of the contacts 14 difficult. However, land grid array contacts are well understood in the art and a further illustration thereof is not specifically required to understand the invention.

Figure 2:
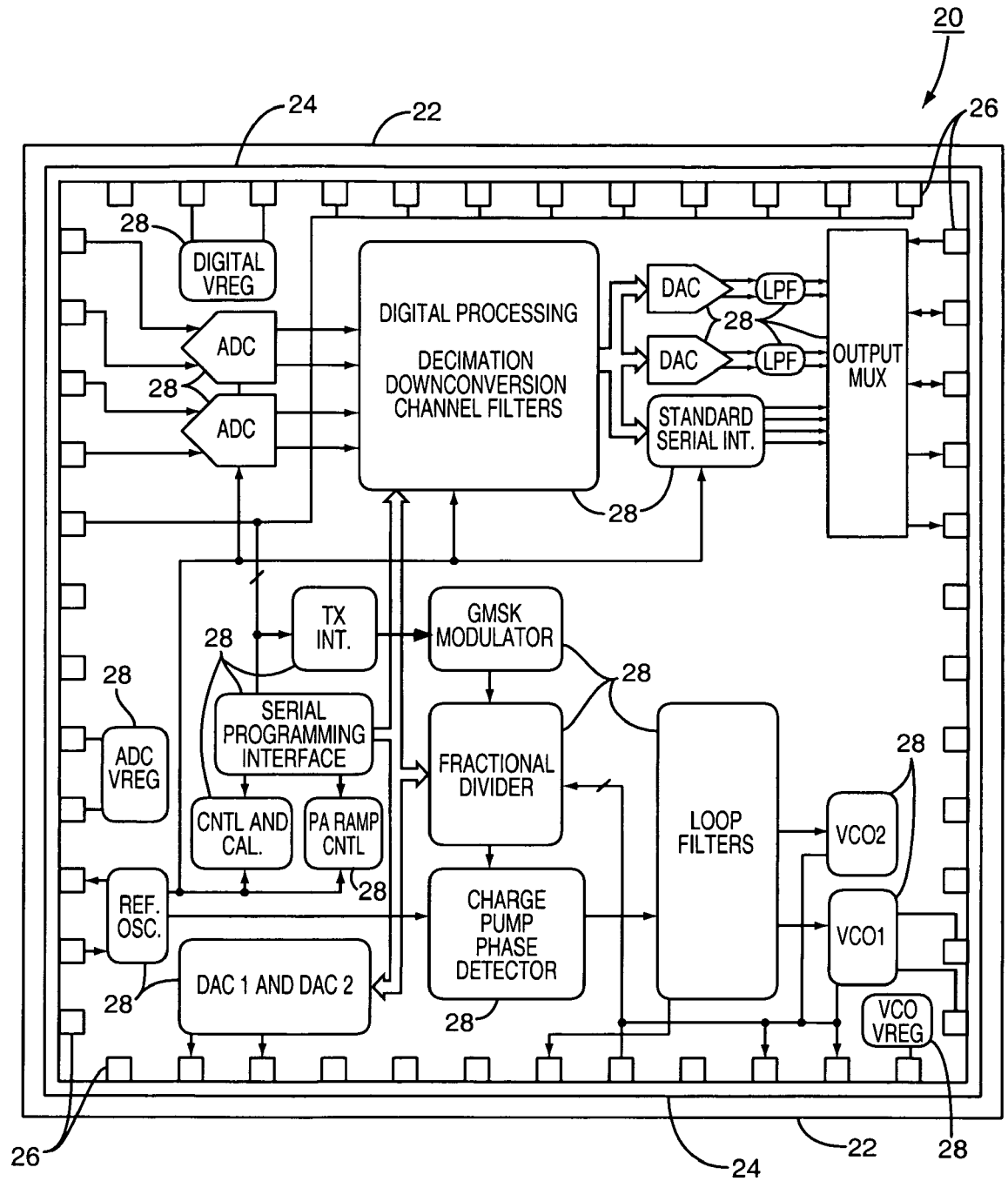
FIG. 2 illustrates a top plan view of an electronic module with an embedded periphery of conductive material.

The present invention provides a technique to shield electronic modules. An electronic module 20, as illustrated in FIG. 2, has been manufactured according to an exemplary embodiment of the present invention. The electronic module 20 has a peripheral edge 22. A conductive element 24 is positioned around the periphery of the electronic module 20 proximate the peripheral edge 22. In an exemplary embodiment, the conductive element 24 is formed on one of the conductive layers within the electronic module 20 and is electrically grounded as better explained below. As used herein, the term "periphery" is defined to be the outermost part or region within a precise boundary, in particular, the boundary formed by the peripheral edge 22. While the conductive element 24 is illustrated as a line in FIG. 2, it should be appreciated that the conductive element 24 has some width and may extend laterally from a point inside the peripheral edge 22 all the way to the peripheral edge 22 if needed or desired (see FIGS. 5, 7 and 9).

As further illustrated, the electronic module 20 has a plurality of contacts 26 proximate the peripheral edge 22 of the electronic module 20. The plurality of contacts 26 allows electrical connection to one or more electronic components 28 within the electronic module 20. Electronic components 28 may include, but are not limited to: Analog to Digital Converters (ADC), Digital to Analog converters (DAC), low pass filters (LPF), filters, voltage controlled oscillators (VCO), multiplexers, and other electronic components as needed or desired based on the function of the electronic module 20. In an exemplary embodiment, all the electronic components 28 are positioned inside the boundary formed by the conductive element 24. The particular electronic components 28 illustrated in FIG. 2 correspond to the components within the RF6001 discussed above. For a more detailed explanation of the electronic components 28, reference is made to the previously incorporated data sheet. However, as is readily understood, the precise electronic components 28 and their precise arrangement are not material to the present invention.

It should be appreciated that during the manufacturing of the electronic module 20, the conductive element 24 is encased within the molding material of the electronic module 20. The molding material may be a plastic dielectric material or the like, as is conventional.

Figure 3:
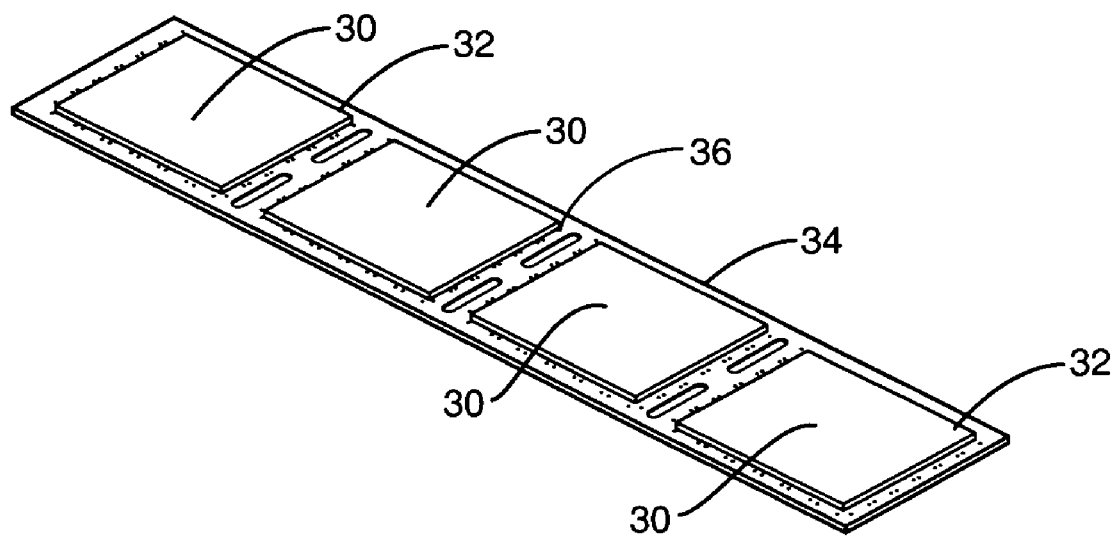
FIG. 3 illustrates a strip of electronic metamodules prior to implementation of the present invention.

FIG. 3 illustrates a plurality of electronic metamodules 30 ready to be used in the methodology of the present invention. In particular, the plurality of electronic metamodules 30 is formed from a plurality of electronic modules 20 within a single molding body 32. The molding bodies 32 are positioned on a strip of laminate 34. The strip of laminate 34 may include apertures 36 (sometimes called fiducials) that may assist in aligning the strip of laminate 34 for the following steps.

Figure 4:
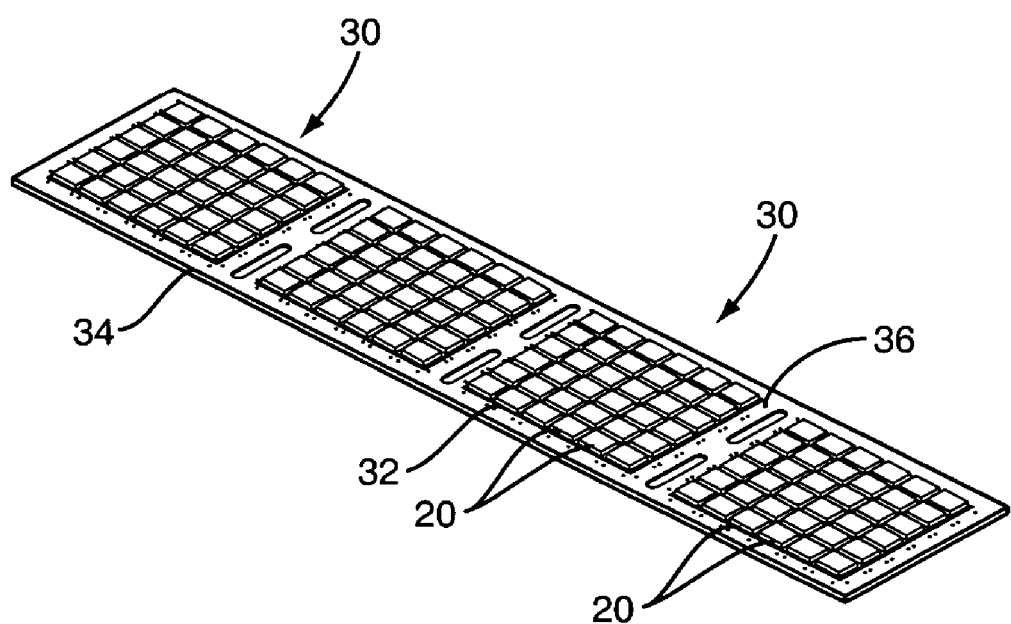
FIG. 4 illustrates the strip of electronic metamodules of FIG. 3 after a sub-dicing operation.

FIG. 4 illustrates the electronic metamodules 30 after the sub-dicing step of the present invention. In particular, each metamodule 30 has been cut such that each of the electronic modules 20 is distinct from one another. The sub-dicing step cuts into each electronic module 20 to expose the conductive element 24, but does not cut through the strip of laminate 34. While not shown, it should be appreciated that dicing tape is positioned on the bottom side of the strip of laminate 34, and may be left in place during the process that follows. Dicing tape is a well known tape that is designed to hold diced components together during submersion in fluids and other processing steps. Exemplary dicing tape is sold by AI Technology Inc. of 70 Washington Road, Princeton Junction, N.J. 08550.

Figure 5:
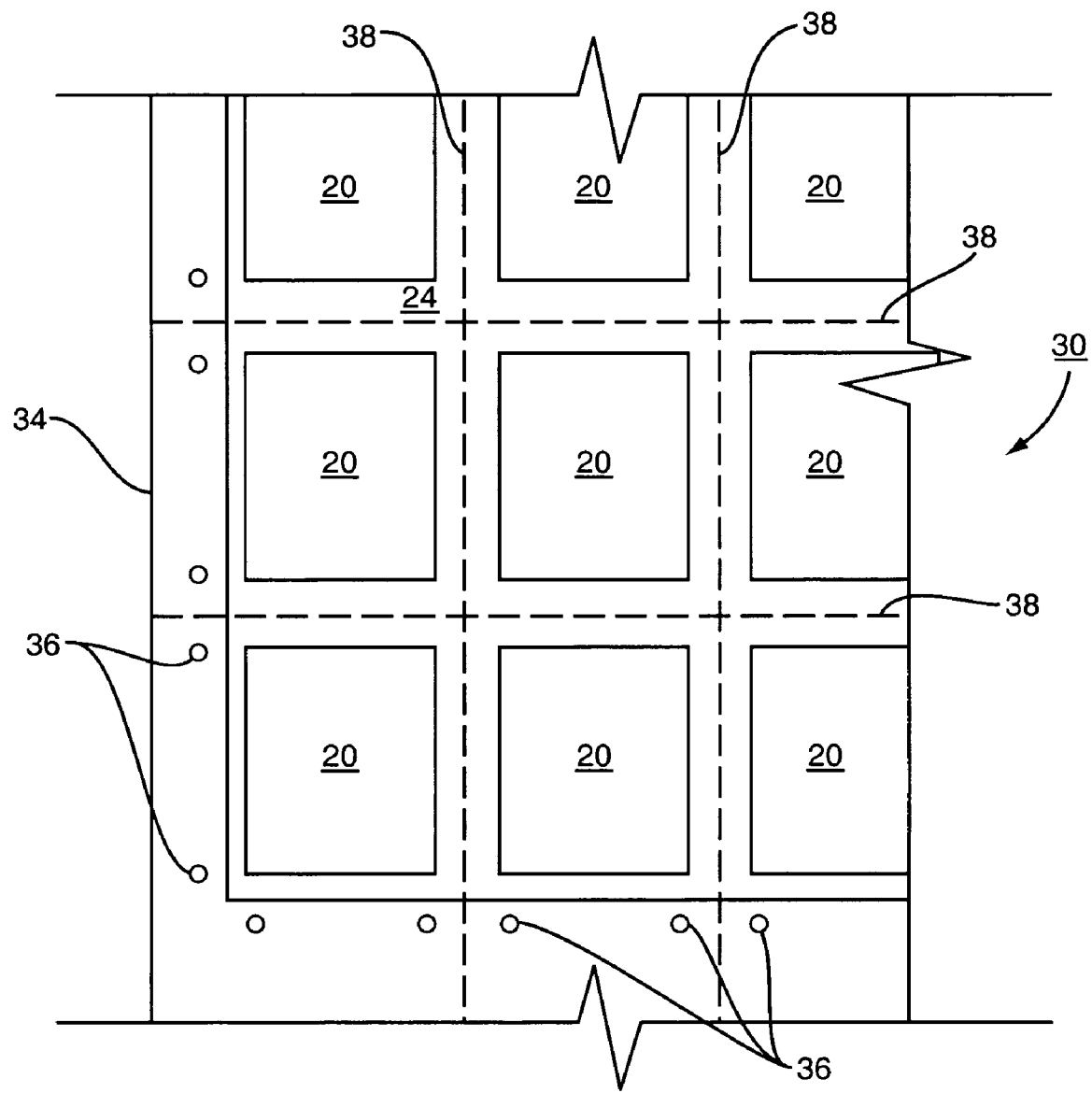
FIG. 5 illustrates a top plan view of part of a metamodule of FIG. 3 with the singulation cuts illustrated.

FIG. 5 illustrates a top plan view of part of an electronic metamodule 30 after subdicing, but before singulation. As is readily apparent, the conductive element 24 is exposed around the periphery of each electronic module 20. Dotted lines 38 represent the cuts made in a singulation process. The singulation process effectively turns the dotted lines 38 into peripheral edges 22 (FIG. 2) of the electronic modules 20.

Figure 6:
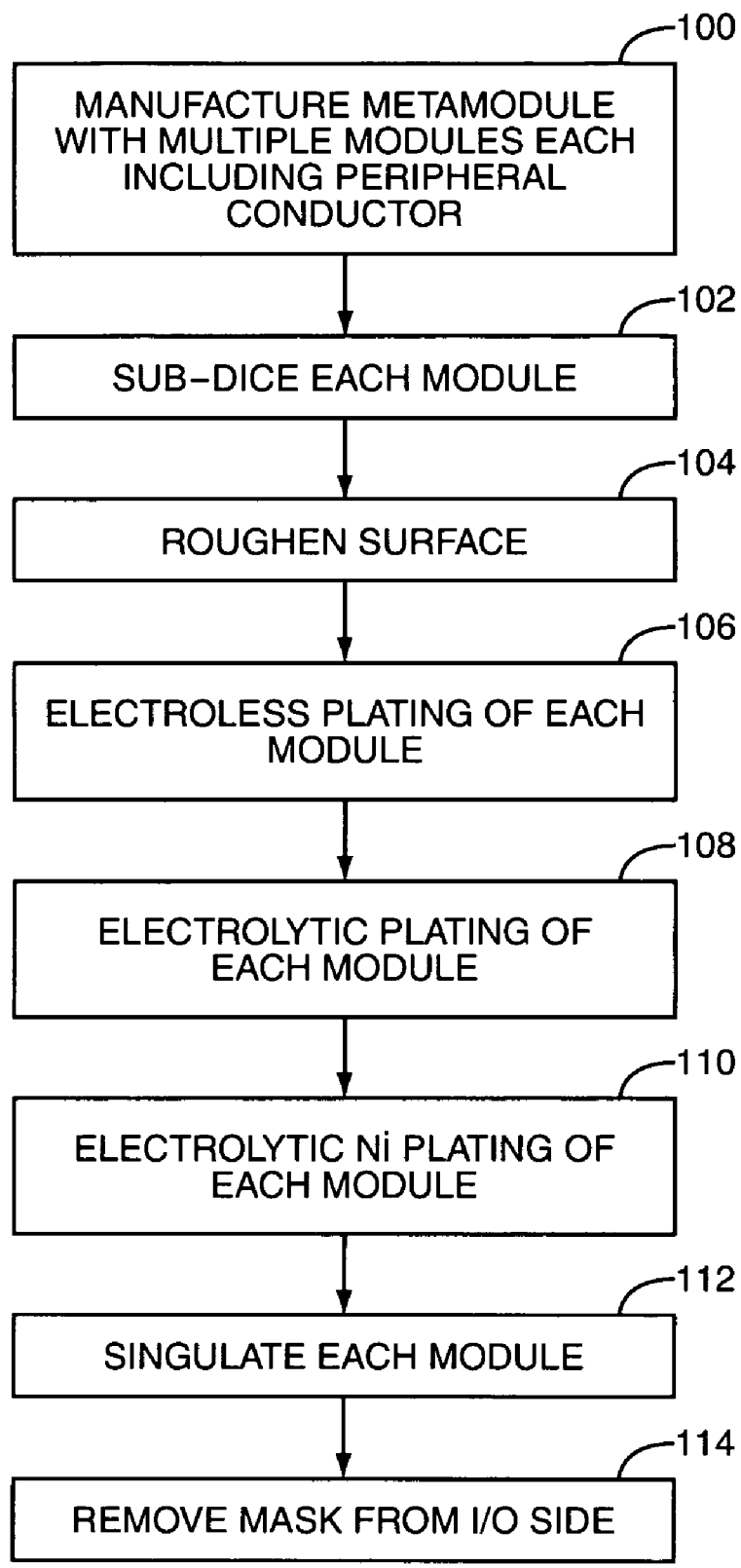
FIG. 6 illustrates as a flow chart exemplary steps of the first embodiment of the present invention.

FIG. 6 illustrates a first exemplary embodiment of the methodology of the present invention. In particular, an electronic metamodule 30 is manufactured, wherein each electronic module 20 within the electronic metamodule 30 has its own conductive element 24 around the periphery of the respective electronic module 20 (block 100). A blade is used to sub-dice each electronic module 20 (block 102) within the electronic metamodule 30. In an exemplary embodiment, the blade is 31 mil (.0787 cm) thick. The sub-dicing step of block 104 exposes the conductive element 24 within the electronic module 20 (see also FIG. 5). As used herein, a "sub-dice" is defined as a cut that does not cut all the way through the element being cut. Thus, "sub-dicing" is cutting an element in such a manner that the cut does not extend all the way through the element being cut. After sub-dicing, the top surface of the electronic metamodule 30 is roughened (block 104). This roughening may be done through an abrasion process, a desmear technique, or other process as needed or desired.

After roughening, an electroless plating process is performed to deposit a seed layer 40 (FIG. 7) of a conductive material on the electronic module 20 (block 106). In an exemplary embodiment, the seed layer 40 of conductive material is copper (Cu), although other conductive materials such as aluminum (Al), silver (Ag), gold (Au), or other conductive material could be used if needed or desired. An electroless plating process is defined herein to be a chemical deposition of metal instead of electrodeposition.

An exemplary electroless plating process of Cu on a dielectric substrate requires the prior deposition of a catalyst such as a palladium-tin (Pd-Sn) colloid consisting of a metallic Pd core surrounded by a stabilizing layer of Sn ions. The activation step (deposition of the colloid) is usually followed by an acceleration step (removal of excess ionic tin). Adhesion of the deposit to the substrate is improved by mechanical and chemical pretreatment steps. Other electroless plating processes could also be used and are considered within the scope of the present invention.

After the seed layer 40 of conductive material is created on the electronic module 20, an electrolytic plating process is performed to deposit a second layer 42 (FIG. 7) of conductive material on the electronic module 20 (block 108). In an exemplary embodiment, the second layer 42 of conductive material may be Cu, Al, Ag, Au, or other material as needed or desired. It should be appreciated that the conductive element 24 is electrically coupled to the seed layer 40, and the seed layer 40 then carries the current for the electrolytic plating process.

Figure 7:
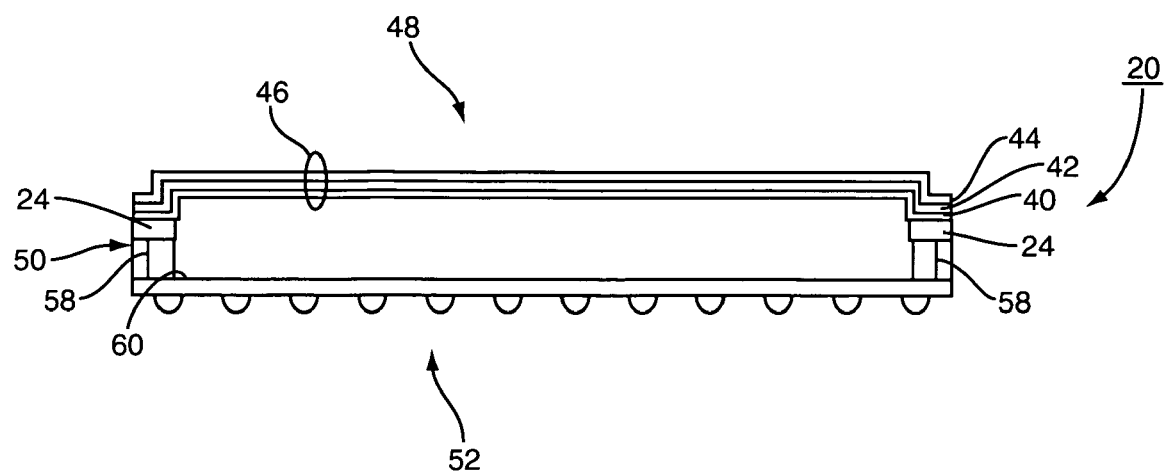
FIG. 7 illustrates an exemplary electronic module constructed according to the first embodiment of FIG. 6.

After the second layer 42 is generated, a third layer 44 (FIG. 7) is created on the electronic module 20 through a second electrolytic plating process (block 110). The third layer 44 is comparatively a poor conductor, and may be a layer of low stress nickel (Ni) or the like. Nickel serves to protect the conductive layers so that they do not tarnish or otherwise suffer from environmental effects. Likewise, nickel may contribute to the shielding function by absorbing electromagnetic radiation. In an exemplary embodiment, the seed layer 40, the second layer 42, and the third layer 44 form a sandwich of shielding material approximately 20 μm thick. This sandwich is labeled shield 46 (FIG. 7). Greater or lesser thicknesses may also be generated. The shield 46 may be positioned on a top surface 48 of the electronic module 20. Additionally, while not specifically illustrated, the shield 46 may be formed on side surfaces 50 of the electronic module 20. Alternatively, vias 58 may form an interior shield for the side surfaces 50 of the electronic module 20. At least one via 58 electrically couples the conductive element 24 to a ground plane 60 within the electronic module so that the conductive element 24 and the shield 46 are electrically gournded.

After the second electrolytic plating process of block 110, each electronic module 20 is singulated (block 112). As used herein, the term "singulation" is defined to be the process wherein the individual electronic modules are separated one from the other such that each module is a single module. Finally, the mask on the underside of the strip of laminate 34 may be removed from an input/output side 52 (FIG. 7) of the electronic module 20 (block 114). It should be appreciated that some steps may be rearranged in the present process. For example, the mask may be removed prior to singulation. Likewise, if a layer 40, 42, or 44 is too thick, the layer may be ground down to a desired thickness. The end result of this embodiment is the electronic module 20 as illustrated in FIG. 7.

Figure 8:
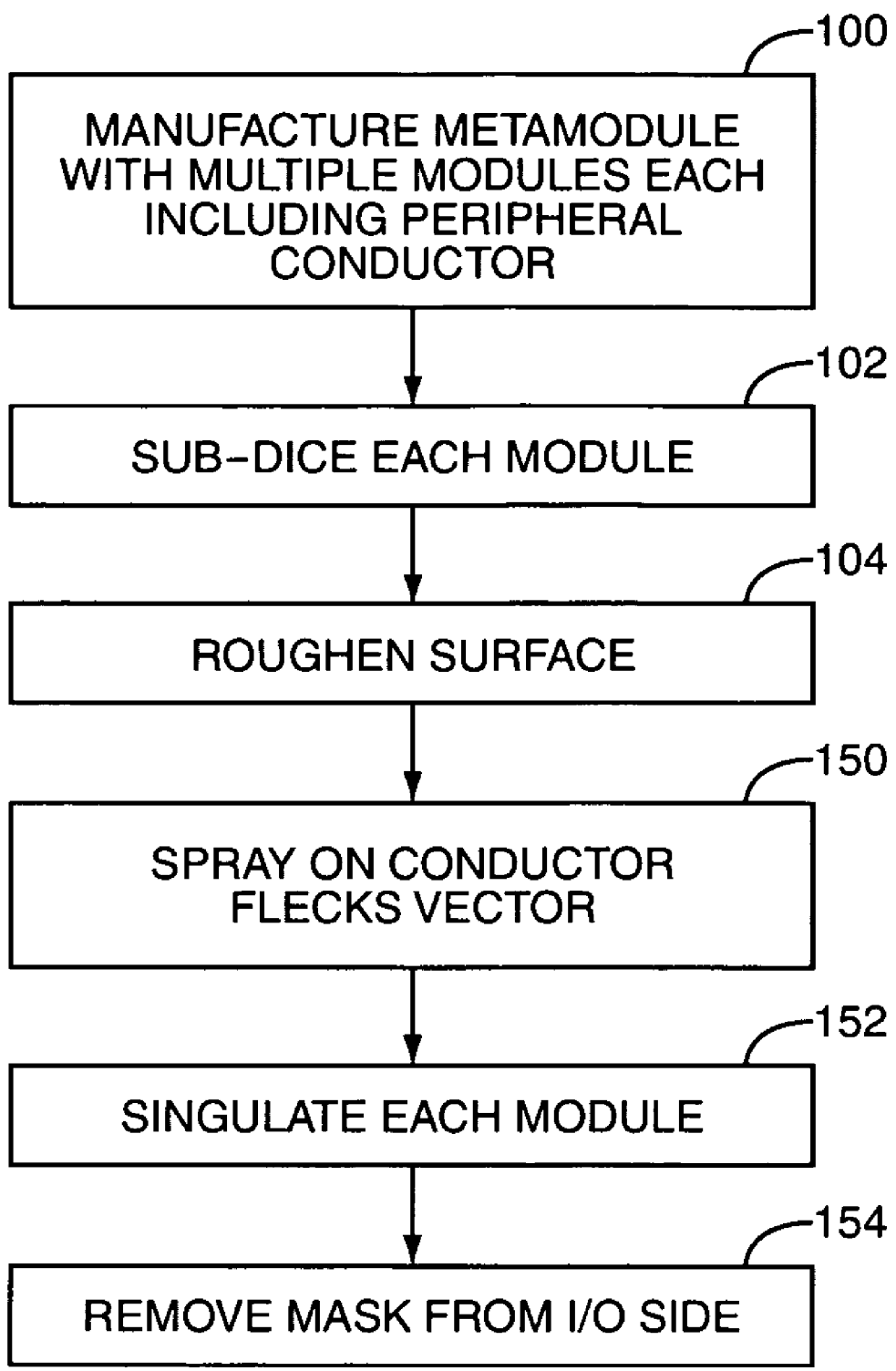
FIG. 8 illustrates as a flow chart exemplary steps of the second embodiment of the present invention.

FIG. 8 illustrates a second embodiment of the methodology of the present invention. The second embodiment starts in a manner similar to the first embodiment, wherein the electronic metamodule 30 is manufactured, with each electronic module 20 within the electronic metamodule 30 having its own conductive element 24 around the periphery of the respective electronic module 20 (block 100). A blade is used to sub-dice each electronic module 20 (block 102). In an exemplary embodiment, the blade is 31 mil (.0787 cm) thick. The sub-dicing step of block 104 exposes the conductive element 24 within the electronic module 20. After sub-dicing, the top surface of the electronic metamodule 30 is roughened (block 104). This roughening may be done through an abrasion process, a desmear technique, or other process as needed or desired.

After roughening, a conductive fleck filled epoxy is sprayed on each of the electronic modules 20 (block 150). In an exemplary embodiment, the conductive fleck filled epoxy is CHO-SHIELD 610 sold by Chomerics of 77 Dragon Court, Woburn, Mass. 01801. More information can be found in the datasheet for CHO-SHIELD 610 available online at http:// vendor.parker.com/Groups/Seal/Divisions/Chomerics/Chomerics %20Product %20Library.nsf/ 24eb4985905ece34852569580074557a/ d93045d8cf22cc0f85256bd700509031/$FILE/ pg140_choshield_conductive_coatings.pdf, which is hereby incorporated by reference in its entirety, and a copy of which is included in the Information Disclosure Statement filed concurrently with the present application. The conductive flecks of the conductive fleck filled epoxy may be Cu, Ag, a mixture of Cu and Ag, a tin/zinc (Sn/Zn) alloy, or other conductive material as needed or desired.

After application of the conductive fleck filled epoxy, each electronic module 20 is singulated (block 152), and the mask is removed from the input/output side 52 of the electronic module 20 (block 154). Again, it should be appreciated that the mask may be removed before singulation if needed or desired. Likewise, while CHO-SHIELD 610 has an epoxy to carry the conductive flecks, other materials such as polyurethane, acrylic, urethane, or the like could be the vector in which the conductive flecks are carried.

Figure 9:
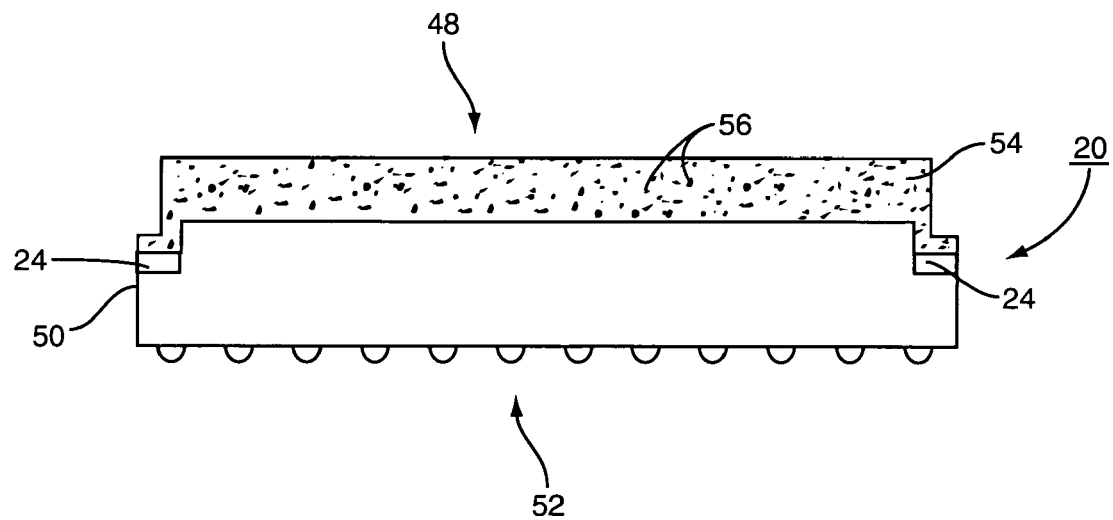
FIG. 9 illustrates an exemplary electronic module constructed according to the second embodiment of FIG. 8.

An electronic module 20 made according to the process of FIG. 8 is illustrated in FIG. 9. A layer of fleck vector 54 is disposed on the top surface 48 of the electronic module 20. Conductive flecks 56 "float" within the fleck vector 54 and form a barrier that stops electromagnetic emissions. Additionally, while not specifically illustrated, the fleck vector 54 may be sprayed on the side surfaces 50 of the electronic module 20. Alternatively, the vias mentioned above may form an interior shield (not shown) for the side surfaces 50 of the electronic module 20.

Those skilled in the art will recognize improvements and modifications to the preferred embodiments of the present invention. All such improvements and modifications are considered within the scope of the concepts disclosed herein and the claims that follow.

What is claimed is:

1. A method of manufacturing an electronic module comprising:
    forming an electronic metamodule comprising a plurality of electronic modules;
    exposing a conductive element associated with each of the plurality of electronic modules to provide exposed conductive elements;
    forming an electromagnetic shield on an exterior surface of each of the plurality of electronic modules by:
        generating a seed layer of conductive material on the exterior surface of each of the plurality of electronic modules and on the exposed conductive elements;
        generating a second layer of material on the seed layer through an electrolytic plating process; and
        generating a third layer of material on the second layer through a second electrolytic plating process; and singulating each of the plurality of electronic modules.

2. The method of claim 1 further comprising removing a masking agent from an input/output side of each of the electronic modules after applying the electromagnetic shield.

3. The method of claim 1 further comprising desmearing a top surface of the electronic metamodule prior to forming the electromagnetic shield.

4. The method of claim 1 wherein generating the seed layer of conductive material on the exterior surface of each of the plurality of electronic modules comprises generating a seed layer of copper (Cu) on the exterior surface.

5. The method of claim 1 wherein generating the seed layer comprises using an electroless plating process to generate the seed layer.

6. The method of claim 1 wherein the second layer comprises a conductive material.

7. The method of claim 6 wherein the second layer is formed from copper (Cu).

8. The method of claim 1 wherein the second layer comprises a material that is a relatively poor conductor compared to the seed layer.

9. The method of claim 8 wherein the second layer is formed from nickel (Ni).

10. The method of claim 1 wherein the third layer comprises a material that is a relatively poor conductor compared to the seed layer.

11. A method of manufacturing an electronic module comprising:
    providing an electronic meta-module comprising a substrate, circuitry on a surface of the substrate and associated with a plurality of electronic modules, and a body formed from a dielectric material that covers the circuitry associated with the plurality of electronic modules, wherein each of the plurality of modules is associated with a conductive element that is covered by the body;
    exposing at least a portion of the conductive element associated with each of the plurality of electronic modules through the body to provide exposed conductive elements;
    forming an electromagnetic shield over portions of an exterior surface of the body for each of the plurality of electronic modules and on the exposed conductive elements, by:
        generating a seed layer of conductive material on the exterior surface of the body for each of the plurality of electronic modules and on the exposed conductive elements;
        generating a second layer of material on the seed layer through an electrolytic plating process; and
        generating a third layer of material on the second layer through a second electrolytic plating process; and
    separating each of the plurality of electronic modules of the electronic meta-module from each other, wherein each of the plurality of electronic module comprises an electromagnetic shield, which is electrically coupled to a corresponding one of the exposed conductive elements.

12. The method of claim 11 wherein the electromagnetic shield material is applied over the portions of the exterior surface of the body prior to each of the plurality of electronic modules being separated from the electronic meta-module.

13. The method of claim 11 further comprising roughening the portions of the exterior surface of the body prior to forming the electromagnetic shield.

14. The method of claim 11 wherein the body is formed by uniformly covering the circuitry associated with the plurality of electronic modules with the dielectric material, such that the body is initially a single, continuous element that covers all of the plurality of electronic modules prior to exposing the exposed conductive elements.

15. The method of claim 11 wherein the body is formed from an overmold material using an overmolding process.

16. The method of claim 11 wherein the conductive elements are formed on the surface of the substrate.

17. The method of claim 11 wherein the conductive element for each of the plurality of modules is part of a metallic grid that is formed on the meta-module and defines a plurality of sub-modules for the plurality of modules.

18. The method of claim 11 wherein generating the seed layer of conductive material on the exterior surface of each of the plurality of electronic modules comprises generating a seed layer of copper (Cu) on the exterior surface.

19. The method of claim 11 wherein generating the seed layer comprises using an electroless plating process to generate the seed layer.

20. The method of claim 11 wherein the second layer comprises a conductive material.

21. The method of claim 20 wherein the second layer is formed from copper (Cu).

22. The method of claim 11 wherein the second layer comprises a material that is a relatively poor conductor compared to the seed layer.

23. The method of claim 22 wherein the second layer is formed from nickel (Ni).

24. The method of claim 11 wherein the third layer comprises a material that is a relatively poor conductor compared to the seed layer.

* * * * *